(12) United States Patent
Takahashi et al.

(10) Patent No.: US 7,915,080 B2
(45) Date of Patent: Mar. 29, 2011

(54) BONDING IC DIE TO TSV WAFERS

(75) Inventors: Yoshimi Takahashi, Beppu (JP);
Masood Murtuza, Sugarland, TX (US);
Rajiv Dunne, Murphy, TX (US);
Satyendra Chauhan, Sugarland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/575,522

(22) Filed: Oct. 8, 2009

(65) Prior Publication Data

US 2010/0159643 A1 Jun. 24, 2010

Related U.S. Application Data

(60) Provisional application No. 61/139,070, filed on Dec. 19, 2008.

(51) Int. Cl.
*H01L 21/98* (2006.01)
(52) U.S. Cl. ........ 438/108; 438/109; 438/459; 438/465; 257/E21.705
(58) Field of Classification Search .......... 438/106–127, 438/459–465
See application file for complete search history.

(56) References Cited

U.S. PATENT DOCUMENTS

| 7,482,193 | B2 * | 1/2009 | DCamp et al. ................. 438/51 |
| 2005/0181543 | A1 * | 8/2005 | Lee et al. ...................... 438/127 |
| 2006/0102994 | A1 * | 5/2006 | Pu .................................. 257/686 |
| 2006/0275949 | A1 * | 12/2006 | Farnworth et al. ............ 438/106 |
| 2008/0230913 | A1 | 9/2008 | Huang et al. |
| 2009/0001598 | A1 * | 1/2009 | Chiou et al. ................... 257/777 |
| 2009/0278244 | A1 * | 11/2009 | Dunne et al. .................. 257/676 |
| 2009/0278245 | A1 * | 11/2009 | Bonifield et al. .............. 257/676 |
| 2009/0280602 | A1 * | 11/2009 | Bonifield et al. .............. 438/118 |
| 2009/0291524 | A1 * | 11/2009 | Takahashi ...................... 438/108 |
| 2010/0065949 | A1 * | 3/2010 | Thies et al. .................... 257/621 |
| 2010/0096738 | A1 * | 4/2010 | Simmons-Matthews et al. .............................. 257/686 |
| 2010/0109129 | A1 * | 5/2010 | Liu et al. ....................... 257/621 |
| 2010/0244241 | A1 * | 9/2010 | Marimuthu et al. .......... 257/737 |

* cited by examiner

*Primary Examiner* — Savitri Mulpuri
(74) *Attorney, Agent, or Firm* — Yingsheng Tung; Wade J. Brady, III; Frederick J. Telecky, Jr.

(57) ABSTRACT

A method for bonding IC die to TSV wafers includes bonding at least one singulated IC die to respective ones of a plurality of IC die on a TSV wafer that includes a top semiconductor surface and TSV precursors including embedded TSV tips to form a die-wafer stack. The die-wafer stack is thinned beginning from the bottom surface of the TSV wafer to form a thinned die-wafer stack. The thinning includes exposing the embedded TSV tips to provide electrical access thereto from the bottom surface of the TSV wafer. The thinned die-wafer stack can be singulated to form a plurality of thinned die stacks.

16 Claims, 6 Drawing Sheets

BONDING IC DIE TO TSV WAFERS

CROSS REFERENCE TO RELATED APPLICATIONS

This application claims the benefit of Provisional Application Ser. No. 61/139,070 entitled "Stacked F2F FCSP flow using Single carrier with post-die stacking TSV tip exposure," filed Dec. 19, 2008, which is herein incorporated by reference in its entirety.

FIELD

Disclosed embodiments relate to integrated circuit (IC) assembly processing, and more particularly to die-to-wafer bonding, where the wafer is a TSV comprising wafer.

BACKGROUND

In order to stack IC die in a face-to-face manner using standard flip-chip assembly techniques, the assembly is conventionally performed in a sequential manner by bonding a first thinned IC die then a second thinned IC die (e.g., 25 to 150 μm) onto a package substrate (e.g., PCB). In a typical arrangement, the first IC die can be a TSV comprising die that is mounted face (i.e. active circuit side) up on the surface of a package substrate where the TSVs form joints with pads on the package substrate surface. Capillary underfill is then generally performed. The second IC die is then generally flip-chip mounted to the active circuit side of the first IC die.

Problems with this conventional sequential stacked die assembly technique include a complicated process flow. There are also difficulties with die-to die jointing via bumps because the first IC die mounted that is on the package substrate may have significant warpage/bow. In addition, since both IC die are thinned and the top active circuit comprising sides are exposed during assembly, die handling is generally difficult and can result in yield loss due to cracked IC die or scratching of the IC die.

SUMMARY

The Inventors have recognized that conventional sequential stacked IC die assembly techniques for forming die-wafer stacks involve handling thin (post-backgrind) wafers involve complicated process flows that generally result in significant yield loss and scratching. Moreover, thin IC die are subject to warpage/bow which complicates jointing and can result in high resistance joints which can lead to degraded circuit performance and/or reliability problems.

Disclosed embodiments provide solutions to the problem of thinning a TSV comprising wafer to expose the TSVs for electrical access from the bottom of the wafer when singulated dies or stacks of singulated IC dies are bonded on the IC die formed on top (i.e. circuit side) of the TSV comprising wafer. By thinning the TSV comprising wafer after the singulated IC die is attached to the top side of the wafer, the assembly flow is significantly simplified and as a result the yield is higher and the scratching is reduced. Moreover, jointing to thick (pre-backgrind) wafers reduces warpage/bow which reduces the contact resistance of the joints, and as a result improves circuit performance and reliability.

DETAILED DESCRIPTION

Figure 1:
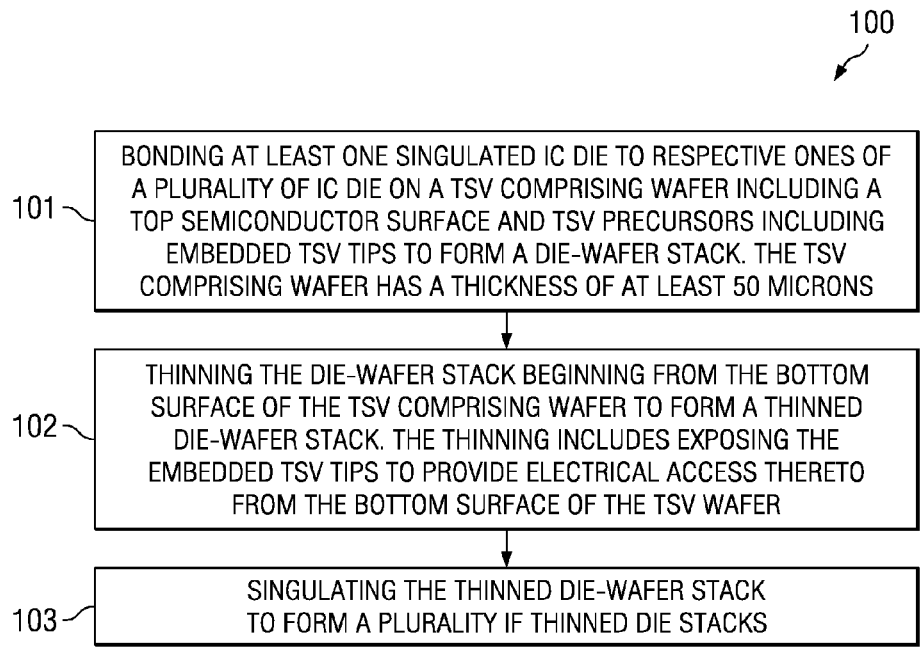
FIG. 1 is a flow chart that shows steps in a method of thinning a die-wafer stack comprising a TSV wafer including a top semiconductor surface including a plurality of IC die that each include TSVs including embedded TSV tips and at least one singulated IC die bonded to the top semiconductor surface of the plurality of IC die, according to an embodiment of the invention.

Disclosed embodiments are described with reference to the attached figures, wherein like reference numerals are used throughout the figures to designate similar or equivalent elements. The figures are not drawn to scale and they are provided merely to illustrate the disclosed embodiments. Several disclosed aspects are described below with reference to example applications for illustration. It should be understood that numerous specific details, relationships, and methods are set forth to provide a full understanding of the disclosed embodiments. One having ordinary skill in the relevant art, however, will readily recognize that embodiments of the invention can be practiced without one or more of the specific details or with other methods. In other instances, well-known structures or operations are not shown in detail to avoid obscuring the disclosure. The disclosed embodiments are not limited by the illustrated ordering of acts or events, as some acts may occur in different orders and/or concurrently with other acts or events. Furthermore, not all illustrated acts or events are required to implement a methodology in accordance with embodiments of the invention.

Disclosed embodiments include methods for thinning a die-wafer stack comprising a wafer including top semiconductor surface and a bottom surface including a plurality of IC die that each include "TSV precursors" including embedded. TSV tips, referred to herein as a "TSV wafer", wherein at least one singulated IC die is bonded to the top semiconductor surface of the plurality of IC die on the TSV wafer. The term "TSV precursor" refers to a structure that following thinning from the bottom side of the TSV wafer is sufficient to provide electrical access to the TSV tips so that the TSV precursors provide through substrate electrical connectivity. As known in the art, active circuitry formed on the top semiconductor surface generally comprises circuit elements including transistors, diodes, capacitors, and resistors, as well as signal lines and other conductors that interconnect these various circuit elements. The die-wafer stack is thinned from the bottom surface of the wafer to form a thinned die-wafer stack, wherein the thinning includes exposing the embedded TSV tips to provide electrical access thereto from the bottom surface of the TSV wafer.

FIG. 1 is a flow chart that shows steps in a method 100 of thinning a die-wafer stack comprising a TSV wafer having a top semiconductor surface and a plurality of IC die and at least one singulated IC die bonded to the top semiconductor surface of the plurality of IC die. Step 101 comprises bonding at least one singulated IC die to respective ones of the plurality of IC die on the TSV wafer having a top semiconductor surface and TSV precursors including embedded TSV tips to form a die-wafer stack. The singulated die is generally thinned or otherwise provided to be a "thinned IC die" defined herein to have a thickness of at least 25 μm, typically from 25 μm to 150 μm. The TSV wafer during bonding is a thick wafer defined herein to have a thickness of at least 50 μm, typically at least 200 μm, that is thinned in step 102 described below. The thinning of the TSV wafer includes exposing the embedded TSV tips to provide electrical access thereto from the bottom surface of the TSV wafer after bonding in step 101. The thinning of the TSV wafer generally comprises backgrinding at least in part and results in the removal of at least 20 μm of thickness from the TSV wafer, and more typically involves removal of 100 μm or more.

As described above, by thinning the TSV wafer after the singulated IC die(s) are attached to the top side of the TSV wafer, the assembly flow is significantly simplified and as a result the assembly yield is higher and the scratching is reduced. Moreover, jointing to thick (pre-backgrind) wafers reduces warpage/bow which reduces the contact resistance of the joints, and as a result improves circuit performance and reliability.

The bonding can be FC bonding. In other embodiments, such as when the singulated IC die includes TSVs, the singulated IC die can be bonded face (i.e. active circuit side) up on the surface of the TSV wafer. Although generally described herein wherein a singulated die is bonded to the TSV wafer, those having ordinary skill in the art will recognize die stacks comprising a plurality of stacked singulated IC die (e.g., stacks of 2, 3 or more die) may be bonded to the TSV wafer based on methodologies disclosed herein.

After bonding, step 102 comprises thinning the die-wafer stack beginning from the bottom surface of the TSV wafer to form a thinned die-wafer stack. As described below, prior to thinning, a mold layer and/or a carrier wafer is generally added to the die-wafer stack opposite to the TSV wafer. The thinning includes exposing the embedded TSV tips to provide electrical access thereto from the bottom surface of the TSV wafer. In certain embodiments, the thinning further comprises exposing the embedded TSV tips to form protruding TSV tips that protrude from the bottom surface of the wafer. In other embodiments, such as when a redistribution layer (RDL) along with lateral bond pads (e.g., copper bond pads) is formed after thinning the bottom side of the TSV wafer, the exposed TSP tips will generally not protrude from the bottom surface of the TSV wafer. Step 103 comprises singulating (e.g., sawing) the thinned die-wafer stack to form a plurality of thinned die stacks.

FIGS. 2A-H show successive cross section depictions associated with an exemplary FC method for forming thinned FC die-TSV wafer stacks and then singulated thinned FC die stacks having electrically accessible TSVs that does not require a carrier wafer, according to an embodiment of the invention. For simplicity, the conventional dielectric liner and the metal diffusion barrier layer that is present for TSVs having metal fillers such as copper are both not shown in the FIGs provided herein. Moreover, as noted above, although embodiments of the invention may generally be described as being FC assembly methods, when the singulated die mounted to the TSV wafer includes TSVs, the singulated die can be mounted face up.

Figure 2A:
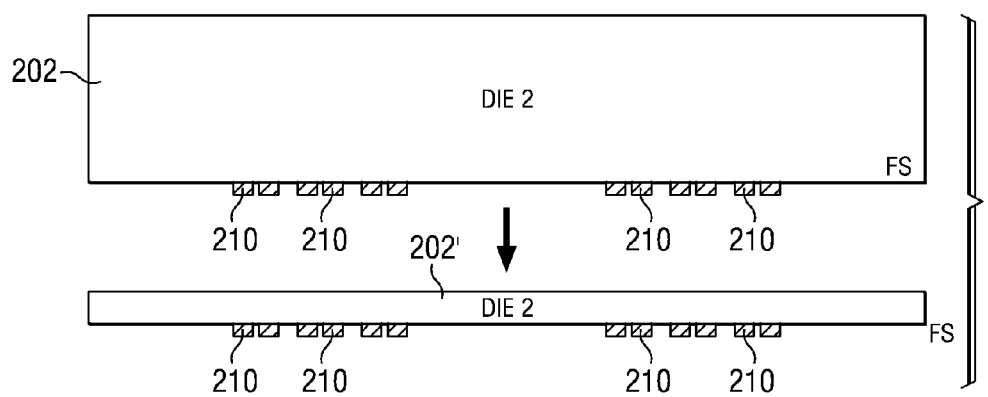
FIGS. 2A-H show successive cross section depictions associated with an exemplary flip chip (FC) assembly method that does not require a carrier wafer for stacking thin singulated die onto a TSV wafer, and forming thinned FC die stacks, according to an embodiment of the invention.
Figure 2B:
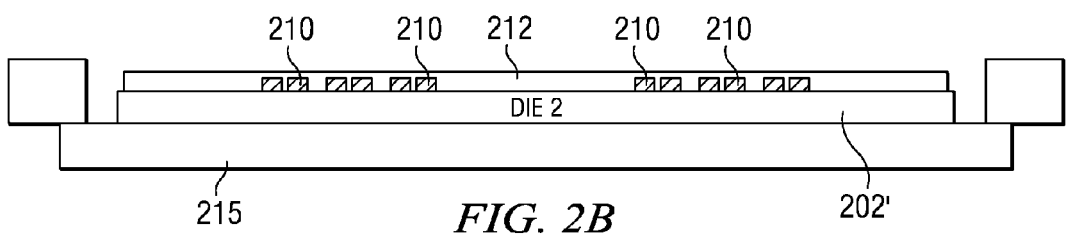
Figure 2C:
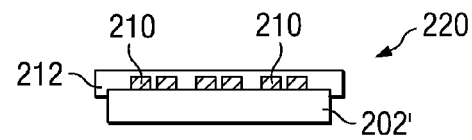
Figure 2D:
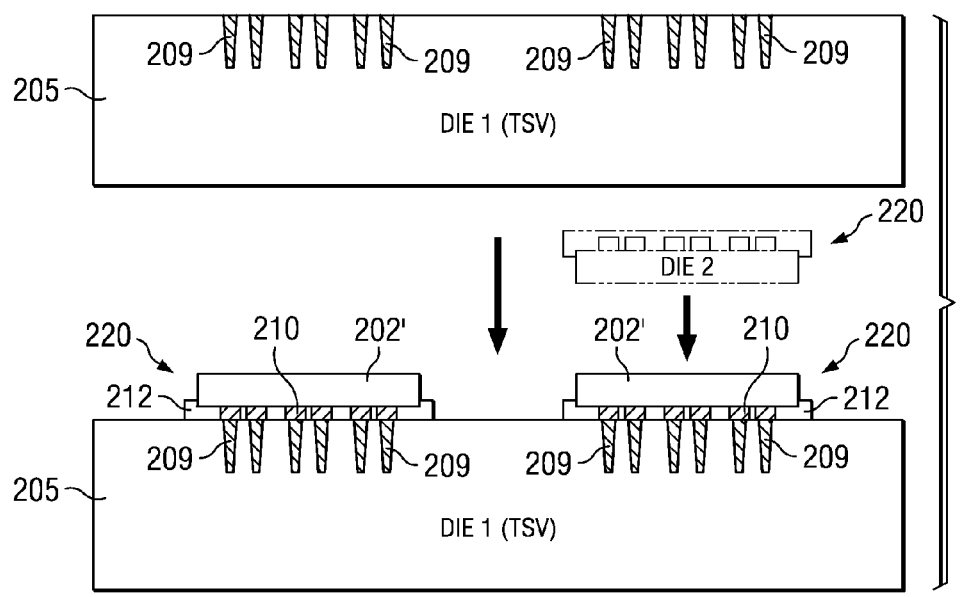

FIGS. 2A-C are related to forming singulated IC die, referred to in the FIGs and this description below as "Die 2". After completing wafer Fab processing (e.g., passivation processing), a wafer 202 having a plurality of Die 2 comprising a plurality of bumps formed on its front-side (FS) is background to a thickness of at least 25 μm, typically from 25 μm to 150 μm, with FIG. 2A providing a cross sectional depiction of the Die 2 wafer 202 both before and after backgrind (referred to herein as 202' after backgrind). Die 2 is shown having a plurality of bumps 210 for FC jointing. Die 2 can be a semiconductor IC, MEMS device or MEMS comprising IC, or a passive device.

A CDF 212 is then applied (e.g., laminated) to the FS of the thinned Die 2 wafer 202' with the resulting cross section depicted in FIG. 2B after being placed onto a dicing film 215. The CDF material prior to curing generally provides a low melt viscosity, such as lower than 500 to 1,000 Pascal-second (Pa·s), and fast curability, such as a 30 second cure time for a temperature of at least 180° C. The CDF can include an optional filler, with the wt. % of the filler in one embodiment based on matching the coefficient of thermal expansion (CTE) of the CDF to the CTE of the lamination area surface. The thickness of the CDF is generally calculated to fill nominal underfill gap area with an additional thickness amount to reflect a manufacturability margin. For example, if the underfill gap is 10 μm, the thickness of the CDF can be from 15 to 20 μm. The CDF material can include flux. As known in the art, a flux refers to a chemically- or physically-active formulation capable of cleaning oxides and enabling wetting of metals (e.g., copper) with solder. Flux is generally included in the CDF when the bonding conductors include highly oxidizable metals, such as copper. Metallic joints are not formed at this step. As described below, the CDF enables heat pressing to form an underfill layer and provides bonding in a single assembly step.

The thinned Die 2 wafer 202' having the CDF thereon is then singulated, such as using a conventional dicing film, into a plurality of singulated Die 2 220 with the resulting cross section depicted in FIG. 2C. The singulated Die 2 220 having the CDF thereon is placed face down (FS down) and bonded to a TSV wafer 205 having a plurality of die shown in FIGS. 2D-I, FIGS. 3A-C, FIGS. 4A-D, and FIGS. 5A-C which is referred to herein as "Die 1" having TSV precursors 209 including embedded TSV tips, with the resulting cross section depicted in FIG. 2D. In this embodiment, after placing, the singulated Die 2 220 and the Die 1 on the TSV wafer are heat pressed together to mount the Die 2 onto the Die 1, using a pressing force (pressure) to result in the bonding conductors (e.g., bumps for FC jointing) on the Die 2 penetrating into the CDF layer 212 to form metallic joints between the bonding conductors and the bonding features on the FS of the Die 1 on the TSV wafer, while the heat is sufficient to result in the CDF forming an underfill layer (e.g., cross-linking). Typical heat pressing conditions can comprise a temperature of 150-180° C., force/area (pressure) during pressing of 35-133 Kgf/cm², and a pressing time between 100-180 sec. Accordingly, in this embodiment a conventional underfill process, such as capillary underfill or a non-conductive paste (NCP) process, is unnecessary.

Figure 2E:
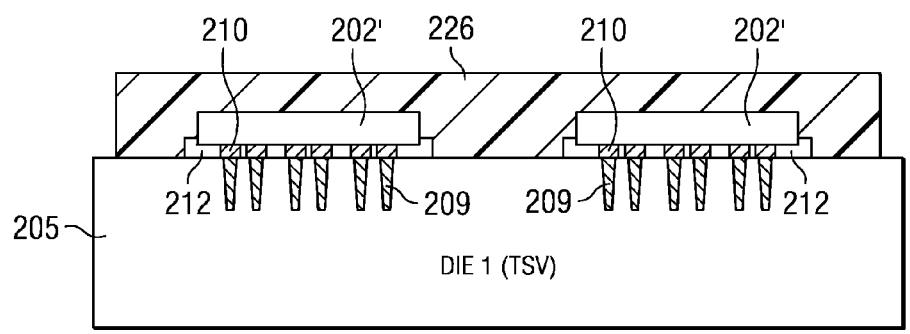

An overmold layer 226 is then added in a thickness sufficient to cover the Die 2 220, with the resulting cross section depicted in FIG. 2E. The TSV wafer is then thinned from its bottom side to form a thinned die-wafer stack generally using a backgrinding step to expose the embedded TSV tips to provide electrical access thereto from the bottom surface of the TSV wafer, with the resulting cross section depicted in FIG. 2F. The thinned TSV wafer is shown as 205'. Although protruding TSV tips are shown in FIG. 2F, in other embodiments of the invention as described above (e.g., RDL comprising), the TSVs 209' are electrically accessible from the bottom side of the TSV wafer, but do not protrude from the bottom surface of the wafer.

Figure 2F:
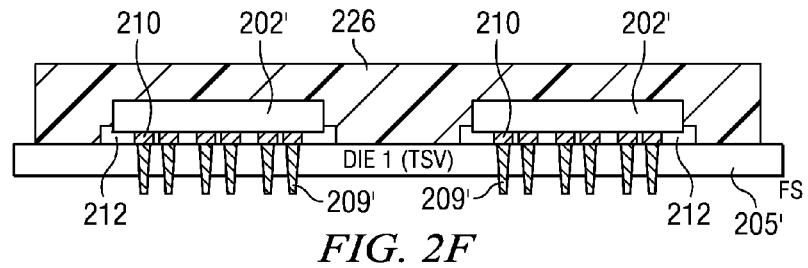
Figure 2G:
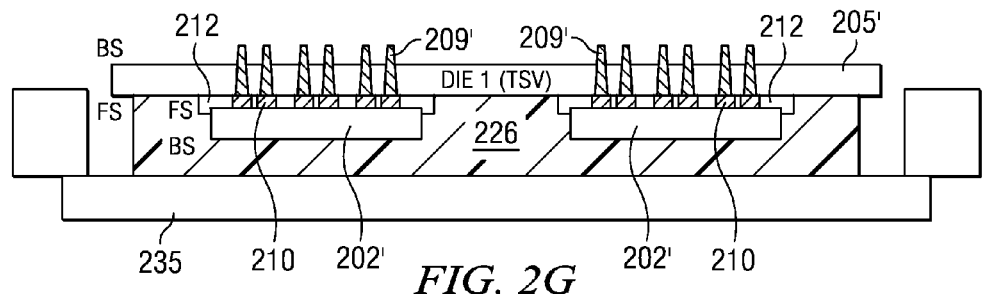

The structure depicted in FIG. 2F is mounted with the overmold layer 226 surface facing down onto a dicing film 235, with the resulting cross section depicted in FIG. 2G. A singulation step follows to provide a plurality of thinned FC die stacks 240 comprising Die 1 bound to Die 2 having underfill therebetween, with the resulting cross section depicted in FIG. 2H.

The thinned die stacks whether FC 240 shown in FIGS. 2A-H or face-up assembled can be interconnected to a package substrate (e.g., an organic or ceramic printed circuit board (PCB) in a variety of assembly sequences. In one assembly sequence, the die stack is mounted to a package substrate followed by a conventional underfill process, such as capillary underfill or a NCP process. In another assembly sequence, described in more detail below relative to FIGS. 5A-C, a CDF is added which becomes interposed between the die stack and the package substrate, wherein heat pressing as described above to provide both jointing and the CDF forming an underfill layer (e.g., cross-linking).

Figure 3A:
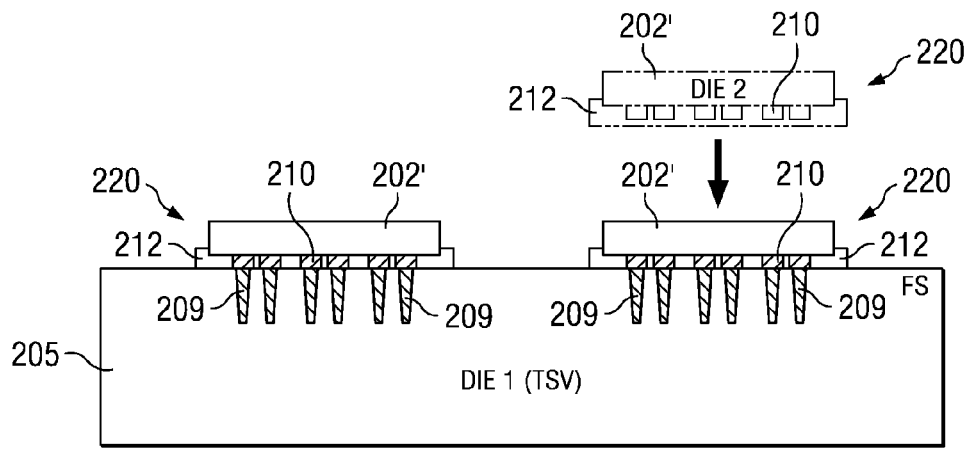
FIGS. 3A-C show successive cross section depictions associated with an exemplary FC method that includes use of a carrier wafer for stacking thin singulated die on a TSV wafer, and forming thinned FC die stacks, according to an embodiment of the invention.
Figure 3B:
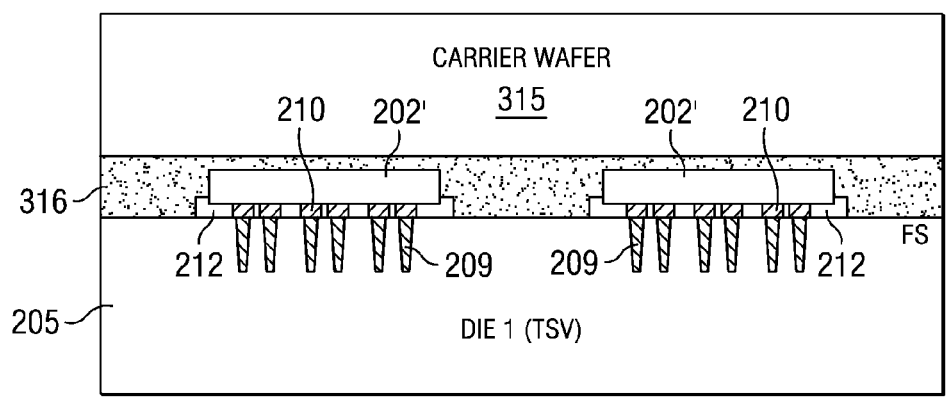
Figure 3C:
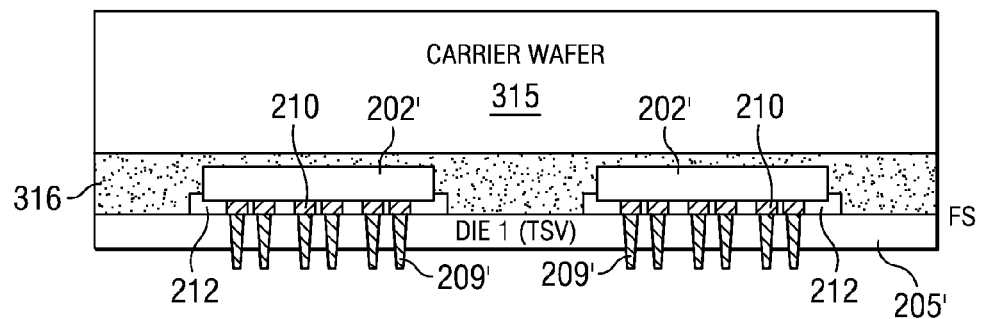

FIGS. 3A-C show successive cross section depictions associated with an exemplary flip chip (FC) method that includes use of a carrier wafer for stacking thin singulated die on a TSV wafer, and forming thinned FC die stacks, according to an embodiment of the invention. Singulated Die 2 220 having the CDF thereon shown in FIG. 2C is placed face down (FS down) and bonded to a TSV wafer 205 having a plurality of Die 1, with the resulting cross section depicted in FIG. 3A. In this embodiment as described above, after placing, the singulated Die 2 220 and the Die 1 on the TSV wafer 205 are heat pressed together to mount the Die 2 220 on the Die 1, using a pressing force (pressure) to result in the bonding conductors (e.g., bumps for FC jointing) 210 of the Die 2 penetrating into the CDF layer 212 to form metallic joints between the bonding conductors and the bonding features on the FS of the Die 1 on the TSV wafer 205, while the heat is sufficient to result in the CDF 212 forming an underfill layer (e.g., cross-linking).

A carrier wafer (e.g., quartz or silicon) 315 is then mounted with an adhesive 316 onto the die-wafer stack shown in FIG. 3A, with the resulting cross section depicted in FIG. 3B. A thermoplastic material can be used to adhere the carrier wafer 315 to the die-wafer stack. The TSV wafer 205 of the die-wafer stack is then thinned from its bottom side to form a thinned die-wafer stack comprising thinned TSV wafer 205' generally using a backgrinding step to expose the embedded TSV tips of TSV precursors 209 to provide TSVs 209' that provide electrical access thereto from the bottom surface of the thinned TSV wafer 205', with the resulting cross section depicted in FIG. 3C. As described above, although protruding TSV tips are shown, in other embodiments of the invention as described above (e.g., RDL comprising), the TSVs 209' are electrically accessible from the bottom side of the TSV wafer 205', but do not protrude from the bottom surface of the wafer.

Figure 2H:
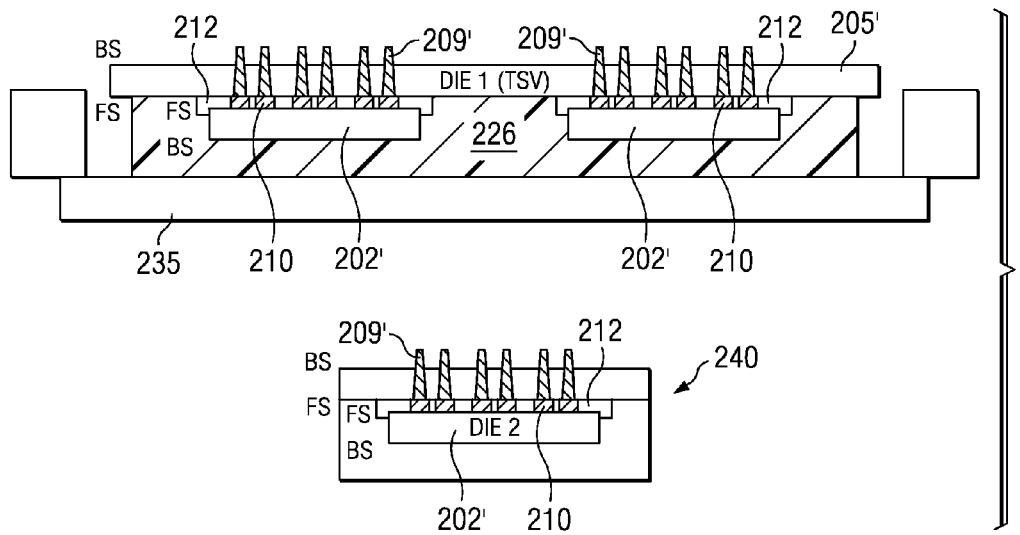

The carrier wafer 316 and the adhesive 316 are then generally removed from the thinned die-wafer stack, followed by a singulation step to provide a plurality of FC die stacks comprising Die 1 bound to Die 2 having conventional underfill such as capillary underfill or a NCP therebetween, with the resulting cross section other than lacking overmold being analogous to 240 shown in FIG. 2H. As described above, the thinned die stacks provided can be interconnected to a package substrate (e.g., PCB) in a variety of assembly sequences. In one assembly sequence, the die stack is mounted to a package substrate followed by conventional underfill process, such as capillary underfill or a NCP process. In another assembly sequence, a CDF is added which becomes interposed between the die stack and the package substrate, wherein heat pressing as described above to provide both jointing and the CDF forming an underfill layer (e.g., cross-linking).

FIGS. 4A-D show successive cross section depictions associated with an exemplary FC method that includes use of an overmold layer for stacking thin singulated die onto a TSV wafer, and forming thinned FC die stacks, according to an embodiment of the invention. The singulated Die 2 220 having the CDF thereon shown in FIG. 2C is placed face down (FS down) and bonded to a TSV wafer 205 having Die 1, with the resulting cross section depicted in FIG. 4A. In this embodiment as described above, after placing, the singulated Die 2 220 and the Die 1 on the TSV wafer 205 are heat pressed together to mount the Die 2 220 (and generally simultaneously mount a plurality of Die 2 220) on the Die 1, using a pressing force (pressure) to result in the bonding conductors 210 (e.g., bumps for FC jointing) of the Die 2 220 penetrating into the CDF layer 212 to form metallic joints between the bonding conductors and the bonding features on the FS of the Die 1 on the TSV wafer 205, while the heat is sufficient to result in the CDF 212 forming an underfill layer (e.g., cross-linking).

Figure 4A:
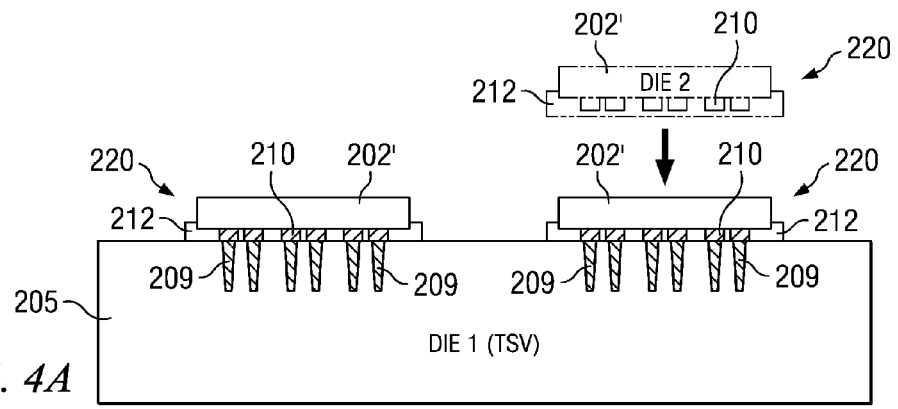
FIGS. 4A-D show successive cross section depictions associated with an exemplary FC method that includes use of an overmold layer for stacking thin singulated die on a TSV wafer, and forming thinned FC die stacks, according to an embodiment of the invention.
Figure 4B:
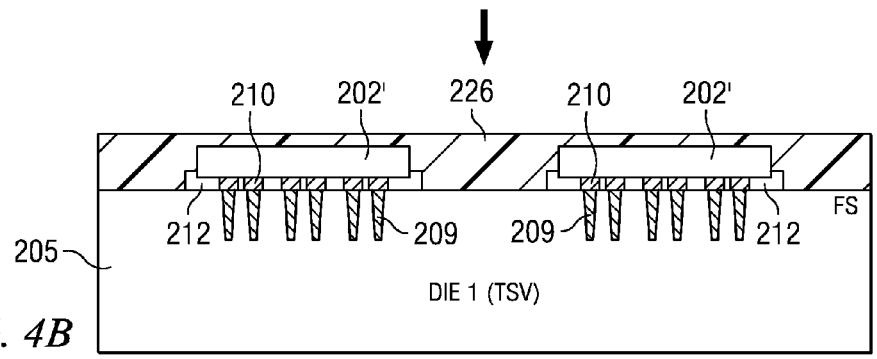
Figure 4C:
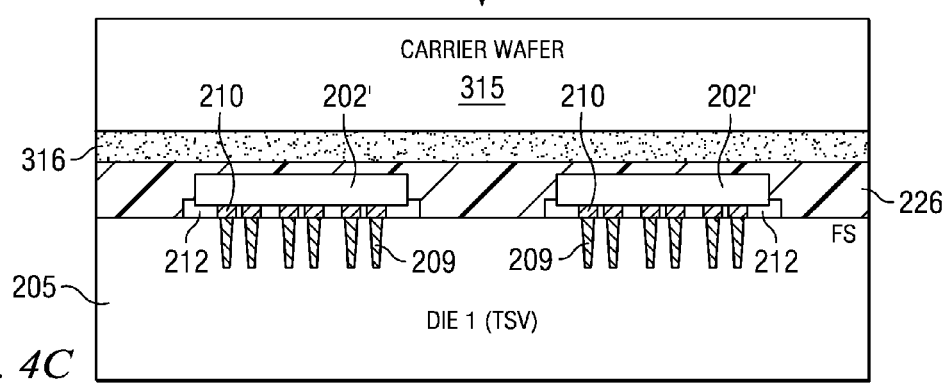
Figure 4D:
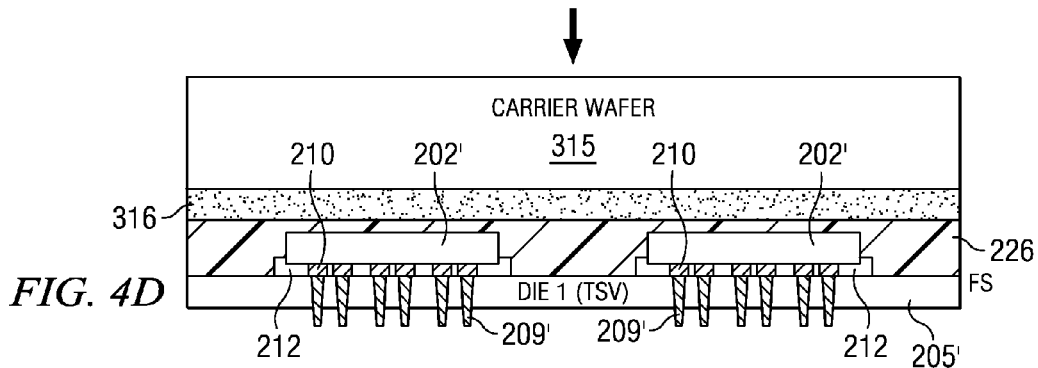

An overmold layer 226 is then added in a thickness sufficient to cover the Die 2 220, with the resulting cross section depicted in FIG. 4B. A carrier wafer 315 (e.g. quartz or silicon) is then mounted with an adhesive 316 onto the molded die-wafer stack shown in FIG. 4B, with the resulting cross section depicted in FIG. 4C. A thermoplastic material can be used to adhere the carrier wafer to the die-wafer stack. The TSV wafer of the molded die-wafer stack having a carrier wafer 315 thereon is then thinned from its bottom side to form a thinned die-wafer stack generally using a backgrinding step to expose the embedded TSV tips to provide electrical access thereto from the bottom surface of the TSV wafer, with the resulting cross section depicted in FIG. 4D. As described above, although protruding TSV tips are shown, in other embodiments of the invention as described above (e.g., RDL comprising), the TSVs are electrically accessible form the bottom side of the TSV wafer, but do not protrude from the bottom surface of the wafer.

The carrier wafer 315 and the adhesive 316 are then generally removed from the thinned die-wafer stack, followed by a singulation step to provide a plurality of FC die stacks comprising Die 1 bound to Die 2 having underfill 212 therebetween, with the resulting cross section analogous to that shown in FIG. 2H. As described above, the thinned die stacks provided can be interconnected to a package substrate (e.g., PCB) in a variety of assembly sequences. In one assembly sequence, the thinned die stack is mounted to a package substrate followed by conventional a conventional underfill process, such as capillary underfill or a NCP process. In another assembly sequence, a CDF is added which becomes interposed between the thinned die stack and the package substrate, wherein heat pressing as described above to provide both jointing and the CDF forming an underfill layer (e.g., cross-linking).

Figure 5A:
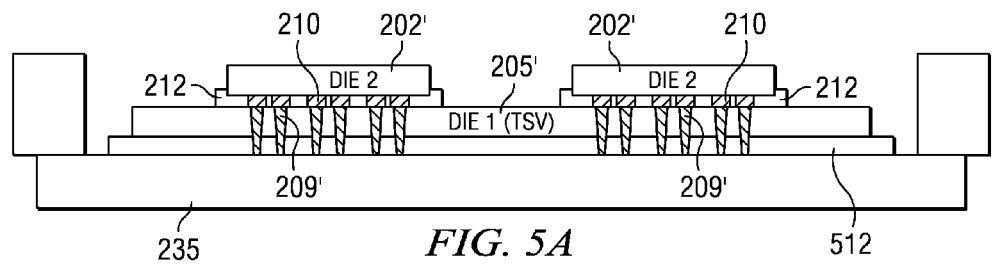
FIGS. 5A-C are successive cross sectional depictions showing an exemplary process for bonding a thinned die stack having a curable dielectric film (CDF) layer to a package substrate, according to an embodiment of the invention.
Figure 5B:
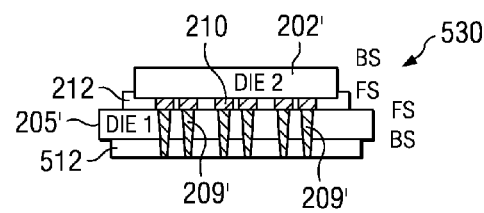
Figure 5C:
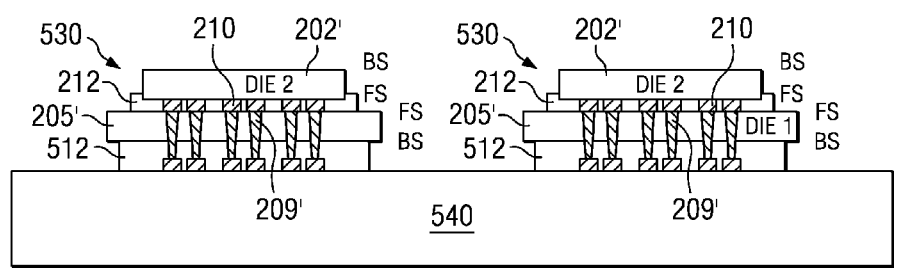

FIG. 5A is a cross sectional depiction of a die-wafer stack shown as reference analogous to that shown in FIG. 3C (absent the carrier wafer 315 and adhesive 316) after subsequent application of a CDF 512 and then mounting onto a dicing film. Singulation (e.g., wafer sawing) results in a thinned die stack having CDF thereon, with a cross sectional depiction shown in FIG. 5B having reference 530. The thinned die stack 530 is then bonded to a package substrate 540 following a compression bonding assembly process step that comprises using a pressing force (pressure) to result in the TSVs 209' of Die 1 penetrating into the CDF layer 512 to form metallic joints between the TSVs 209' and the bonding features on the package substrate, with a cross sectional depiction shown in FIG. 5C. As described above, the heat applied in this step is sufficient to result in the CDF 512 forming an underfill layer (e.g., cross-linking). However, as described above, in another embodiment of the invention, the thinned die stack is mounted to a package substrate followed by a conventional capillary underfill or a NCP process.

Embodiments of the invention can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, embodiments of the invention can be used in a variety of processes including bipolar, CMOS, BiCMOS and MEMS.

While various embodiments of the invention have been described above, it should be understood that they have been presented by way of example only, and not limitation. Numerous changes to the disclosed embodiments can be made in accordance with the disclosure herein without departing from the spirit or scope of the disclosed embodiments. Thus, the breadth and scope of embodiments of the invention should not be limited by any of the above explicitly described embodiments. Rather, the scope of the invention should be defined in accordance with the following claims and their equivalents.

Although the embodiments of the invention have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such a feature may be combined with one or more other features of the other implementations as may be desired and advantageous for any given or particular application.

The terminology used herein is for the purpose of describing particular embodiments only and is not intended to be limiting to embodiments of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

The invention claimed is:

1. A method of thinning a die-wafer stack comprising a wafer including a top semiconductor surface and a bottom surface including a plurality of IC die that each include TSV precursors having embedded TSV tips, and at least one singulated IC die bonded to said top semiconductor surface of said plurality of IC die, comprising:
    forming a mold layer on top of said singulated IC die and the wafer;
    thinning said die-wafer-mold-layer stack from said bottom surface of said wafer to form a thinned die-wafer stack having protruding TSV tips that protrude from said bottom surface of said wafer to provide electrical access thereto from said bottom surface.

2. The method of claim 1, wherein said wafer is >125 µm thick before said thinning and said singulated IC die is <150 µm thick.

3. The method of claim 1,
    further comprising forming said die-wafer stack, wherein said forming said die-wafer stack comprises:
    providing a curable dielectric film (CDF) between said singulated IC die and said top semiconductor surface of said wafer, and
    bonding comprising a heat pressing process that provides compression molding to form underfill from said CDF and jointing to form said singulated IC die bonded to said top semiconductor surface of said plurality of IC die in a single process.

4. The method of claim 1, further comprising forming said die-wafer stack, wherein said forming said die-wafer stack comprises:
    bonding said singulated IC die to said top semiconductor surface of said wafer, and
    undefilling with an underfill material or a non-conductive paste (NCP) after said bonding.

5. The method of claim 1, further comprising adhering a carrier wafer on top of said singulated IC die before said thinning.

6. The method of claim 5, wherein said forming a mold layer comprises overmolding a mold material to cover said singulated IC die before said thinning.

7. The method of claim 3, wherein said bonding comprises flip chip bonding.

8. The method of claim 3, wherein said singulated IC die comprises a plurality of TSVs, and wherein said bonding comprises face-up bonding.

9. The method of claim 5, wherein said adhering said carrier wafer on top of said singulated IC die comprises adding an adhesive layer for adhering said carrier wafer on top of said singulated IC die and removing said adhesive layer and said carrier wafer after said thinning.

10. A method of thinning a die-wafer stack comprising a wafer including a top semiconductor surface and a bottom surface including a plurality of IC die that each include TSV precursors having embedded TSV tips, and at least one singulated IC die bonded to said top semiconductor surface of said plurality of IC die, comprising:
    forming a mold layer comprising overmolding with a sufficient mold thickness to cover said singulated IC die, and then adhering a carrier wafer with an adhesive layer on top of said mold layer;

thinning said die-wafer stack from said bottom surface of said wafer to form a thinned die-wafer stack having protruding TSV tips that protrude from said bottom surface of said wafer to provide electrical access thereto from said bottom surface; and removing said adhesive layer and said carrier wafer after said thinning.

11. A method of die-to-wafer bonding, comprising:

providing (i) a wafer comprising a top semiconductor surface and bottom surface having a plurality of IC die formed thereon, said plurality of IC die having active circuitry on said top semiconductor surface and a plurality of through substrate vias (TSV) precursors having embedded TSV tips that extend from at least said top semiconductor surface to a depth in said wafer that does not extend to said bottom surface, and (ii) a plurality of singulated IC die comprising an active die side having bond pads thereon;

bonding said plurality of singulated IC die to respective ones of said plurality of IC die on said top semiconductor surface of said wafer to form a die-wafer stack, adhering a carrier wafer on said plurality of singulated IC die using an adhesive layer;

thinning said die-wafer stack from said bottom surface of said wafer to form a thinned die-wafer stack, protruding TSV tips that protrude from said bottom surface of said wafer to provide electrical access thereto from said bottom surface;

singulating said thinned die-wafer stack to form a plurality of singulated die stacks;

providing a package substrate having a surface including land pads thereon, and bonding at least one of said plurality of singulated die stacks to said land pads of said package substrate, wherein said protruding TSV tips are joined to said land pads; and removing said adhesive layer and said carrier wafer.

12. The method of claim 11, further comprising providing a curable dielectric film (CDF) between said singulated die stack and said package substrate before said bonding, wherein said bonding comprising a heat pressing process that provides compression molding to form underfill from said CDF and jointing to bond said protruding TSV tips to said land pads in a single process.

13. The method of claim 11, further comprising providing a curable dielectric film (CDF) between said plurality of singulated IC die and said top semiconductor surface of said wafer, and wherein said bonding comprises a heat pressing process that provides compression molding to form underfill from said CDF and jointing to bond said plurality of singulated IC die bonded to said top semiconductor surface of said plurality of IC die in a single process.

14. The method of claim 11, further comprising between sad bonding and said thinning:

forming a mold layer comprising overmolding with a sufficient mold thickness to cover said plurality of singulated IC die;

adhering a carrier wafer with an adhesive layer on top of said mold layer before said thinning, and removing said adhesive layer and said carrier wafer after said thinning.

15. A method of forming die stacks, comprising:

providing (i) a wafer comprising a top semiconductor surface and bottom surface having a plurality of IC die formed thereon, said plurality of IC die having active circuitry on said top semiconductor surface and a plurality of through substrate via (TSV) precursors having embedded TSV tips that extend from at least said top semiconductor surface to a depth in said wafer that does not extend to said bottom surface, and (ii) a plurality of singulated IC die comprising an active die side having bond pads thereon;

flip chip bonding said plurality of singulated IC die to respective ones of said plurality of IC die on said top semiconductor surface of said wafer to form a die-wafer stack;

forming at least a mold layer or adhering a carrier wafer on top of said plurality of singulated IC die between said flip chip bonding;

thinning comprising backgrinding said die-wafer stack from said bottom surface of said wafer to form a thinned die-wafer stack, wherein said thinning includes exposing said embedded TSV tips to provide electrical access thereto from said bottom surface, and singulating the thinned die-wafer stack to form a plurality of thinned die stacks.

16. The method of claim 15, further comprising:

providing a curable dielectric film (CDF) between said plurality of singulated IC die and said top semiconductor surface of said wafer before said flip chip bonding, and wherein said flip chip bonding comprises a heat pressing process that provides compression molding to form underfill from said CDF and jointing to bond said singulated IC die bonded to said top semiconductor surface of said plurality of IC die in a single process.

\* \* \* \* \*